United States Patent
Lee et al.

(10) Patent No.: US 8,904,628 B2
(45) Date of Patent: Dec. 9, 2014

(54) METHOD OF MANUFACTURING NOISE REMOVING FILTER

(71) Applicant: Samsung Electro-Mechanics Co., Ltd., Gyeonggi-do (KR)

(72) Inventors: Sang Moon Lee, Seoul (KR); Sung Kwon Wi, Seoul (KR); Jeong Bok Kwak, Gyeonggi-do (KR); Won Chul Sim, Gyeonggi-do (KR); Young Seuck Yoo, Seoul (KR); Yong Suk Kim, Gyeonggi-do (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 198 days.

(21) Appl. No.: 13/716,841

(22) Filed: Dec. 17, 2012

(65) Prior Publication Data

US 2013/0152379 A1 Jun. 20, 2013

(30) Foreign Application Priority Data

Dec. 19, 2011 (KR) .......................... 10-2011-0137426

(51) Int. Cl.
- *G11B 5/127* (2006.01)
- *H03H 3/00* (2006.01)
- *G11B 5/31* (2006.01)
- *H03H 1/00* (2006.01)

(52) U.S. Cl.
CPC .............. *H03H 3/00* (2013.01); *G11B 5/3163* (2013.01); *H03H 1/0007* (2013.01); *H03H 2001/0092* (2013.01)
USPC ........ 29/603.16; 29/592.1; 29/594; 29/602.1; 29/604; 29/607; 29/603.14; 29/603.15; 29/825; 29/842; 29/854; 336/200; 336/65; 336/83; 336/206; 336/232; 216/2; 216/22; 216/37; 216/41; 216/100; 335/296; 333/185; 363/40; 451/28; 451/30

(58) Field of Classification Search
CPC .................. H03H 3/00; H03H 1/0007; H03H 2001/0092; G11B 5/3163; G11B 5/3116; G11B 5/1278
USPC .......... 29/592.1, 594, 602.1, 604–607, 609.1, 29/825, 842, 854, 856, 858, 883, 603.13, 29/603.14, 603.15, 603.16; 335/296; 333/185; 363/40; 451/28, 30; 216/2, 216/22, 37, 41, 42, 52, 95, 100; 336/200, 336/65, 83, 206–208, 232
See application file for complete search history.

(56) References Cited

U.S. PATENT DOCUMENTS

| | | | | |
|---|---|---|---|---|
| 6,420,772 B1 * | 7/2002 | Kimmel et al. | ................ | 257/529 |
| 7,911,289 B2 * | 3/2011 | Lee et al. | ......................... | 333/12 |

(Continued)

FOREIGN PATENT DOCUMENTS

| | | |
|---|---|---|
| JP | 2006-024772 A | 1/2006 |
| JP | 2009-218644 A | 9/2009 |

*Primary Examiner* — Peter DungBa Vo
*Assistant Examiner* — Azm Parvez
(74) *Attorney, Agent, or Firm* — Bracewell & Giuliani LLP; Brad Y. Chin

(57) ABSTRACT

Disclosed herein is a method of manufacturing a noise removing filter, including preparing at least one conductive pattern, an insulating layer for covering the at least one conductive pattern, and a lower magnetic body including input/output stud terminals for electrically inputting and outputting electricity to and from the at least one conductive pattern; disposing a recognizable portion on upper surfaces of the input/output stud terminals; disposing an upper magnetic body on the recognizable portion and the insulating layer; polishing the upper magnetic body; and removing the recognizable portion such that a level of an upper surface of the upper magnetic body is higher than levels of the upper surfaces of the input/output stud terminals.

6 Claims, 5 Drawing Sheets

(56) References Cited

U.S. PATENT DOCUMENTS

| | | | |
|---|---|---|---|
| 8,050,045 B2 * | 11/2011 | Okuzawa et al. | 361/763 |
| 8,080,167 B2 * | 12/2011 | Watanabe et al. | 216/22 |
| 8,137,571 B2 * | 3/2012 | Okada et al. | 216/22 |
| 8,174,349 B2 * | 5/2012 | Yoshida et al. | 336/200 |
| 8,460,565 B2 * | 6/2013 | Lee et al. | 216/22 |
| 8,471,668 B2 * | 6/2013 | Hsieh et al. | 336/200 |
| 8,564,393 B2 * | 10/2013 | Nishikawa et al. | 336/200 |
| 2012/0008231 A1 * | 1/2012 | Tsuchiyama et al. | 360/59 |

* cited by examiner

- PRIOR ART -

- PRIOR ART -

- PRIOR ART -

- PRIOR ART -

METHOD OF MANUFACTURING NOISE REMOVING FILTER

CROSS REFERENCE(S) TO RELATED APPLICATIONS

This application claims the benefit under 35 U.S.C. Section 119 of Korean Patent Application Serial No. 10-2011-0137426 entitled "Method of Manufacturing Noise Removing Filter" filed on Dec. 19, 2011, which is hereby incorporated by reference in its entirety into this application.

BACKGROUND OF THE INVENTION

1. Technical Field

The present invention relates to a noise removing filter, and more particularly, to a method of manufacturing a noise removing filter, by which the noise removing filter may obtain high magnetic permeability so as to improve impedance characteristics by using a simple structure and process, thereby increasing the performance of the noise removing filter.

2. Description of the Related Art

Electronic devices such as digital televisions (TVs), smart phones, or notebook computers have been widely used in terms of data transmission/receiving functions in a high-frequency band. Also, in the future, it is expected that these information technology (IT) electronic products will be more frequently used not only as multi-functional products and complex products by connecting the products to each other via a universal serial bus (USE) or other communication ports, but also, as a single device.

In this case, in order to rapidly transmit and receive data, a frequency band is moved from a low frequency band of MHz band to a high frequency band of GHz such that data may be transferred through as large as possible amounts of internal signal lines.

When data is transmitted between a main device and a peripheral device in a high frequency of GMz band in order to transmit and receive a large amount of data, it is seriously difficult to smoothly process data due to signal delay and other noises.

Thus, there is a need for obtaining immunity of an electronic device in order not only to prevent the electronic device itself from acting as a noise source, but to also prevent malfunction of the electronic device from occurring due to external noise.

In order to overcome these problems, an IT electronic device includes anti-electron magnetic interference (EMI) components installed around connectors between the IT electronic device and peripheral devices. However, a typical anti-EMI component is a wound or stack type component, has a large chip size, and has low electrical properties, and thus, is used only in a predetermined portion or a limited portion such as a large area circuit board. Accordingly, there is a need for anti-EMI components that can meet the development of slimmed, miniaturized, complex, and multi-functional products.

Hereinafter, a typical anti-EMI coil component, that is, a typical common mode filter of a noise removing filter will be described in detail with reference to FIGS. 1 through 2C.

Referring to FIGS. 1 through 2C, a typical common mode filter includes a lower magnetic substrate 10, an insulating layer 20 that is disposed on the lower magnetic substrate 10 and in which primary coil patterns 21 and secondary coil patterns 22 are formed to be symmetrical in a vertical direction, and an upper magnetic body 30 disposed on the insulating layer 20.

In this case, the insulating layer 20 is formed on the lower magnetic substrate 10 by a thin film process in such a way that the primary coil patterns 21 and the secondary coil patterns 22 may be formed in the insulating layer 20. An example of the thin film process is disclosed in Japanese Patent Publication No. 1996-203737.

In addition, a first input lead pattern 21a for inputting electricity to the primary coil patterns 21 and a first output lead pattern 21b for outputting electricity from the primary coil patterns 21, and a second input lead pattern 22a for inputting electricity to the secondary coil patterns 22 and a second output lead pattern 22b for outputting electricity from the secondary coil patterns 22 are formed on the insulating layer 20.

In more detail, the insulating layer 20 includes a first coil layer including the primary coil patterns 21 and the first input lead pattern 21a, a second coil layer including the secondary coil patterns 22 and the second input lead pattern 22a, and a third coil layer including the first output lead pattern 21b and the second output lead pattern 22b.

That is, the first coil layer is formed by forming the primary coil patterns 21 and the first input lead pattern 21a on an upper surface of the lower magnetic substrate 10 by a thin film process and then coating an insulating material on the resulting structure.

In addition, the second coil layer is formed by forming the secondary coil patterns 22 corresponding to the primary coil patterns 21 and the second input lead pattern 22a on an upper surface of the first coil layer by a thin film process and then coating an insulating material on the resulting structure.

Then, the third coil layer is formed by forming the first output lead pattern 21b and the second output lead pattern 22b on an upper surface of the second coil layer by a thin film process for external output of the primary coil patterns 21 and the secondary coil patterns 22 and then coating an insulating material on an upper surface of the second coil layer.

In this case, the primary coil patterns 21 and the secondary coil patterns 22 may be electrically connected to the first output lead pattern 21b and the second output lead pattern 22b through via connecting structures, respectively.

In addition, the first input lead pattern 21a is connected to a first input stud terminal 41a. The first output lead pattern 21b is connected to a first output stud terminal (not shown) corresponding to the first input stud terminal 41a. The second input lead pattern 22a is connected to a second input stud terminal 42a. The second output lead pattern 22b is connected to a second output stud terminal (not shown) corresponding to the second input stud terminal 42a.

Although not illustrated in detail, the first coil layer through the third coil layer may each be prepared in the sheet form and may be combined with each other in a stacking manner so as to constitute an insulating layer including the first and secondary coil patterns 21 and 22, the first and second input lead patterns 21a and 22a, and the first and second output lead patterns 21b and 22b.

In the above-described typical common mode filter, the upper magnetic body 30 is formed by filling a space with a composite material obtained by mixing ferrite with resin as a binder in order to increase adhesive properties with the insulating layer 20, insulating properties, and breakdown voltage properties. In this case, the magnetic permeability of the common mode filter seriously deteriorates due to the resin included in the upper magnetic body 30, thereby reducing the performance and characteristics of the common mode filter.

Thus, if ferrite having a large diameter is used in the upper magnetic body 30 in order to increase the magnetic permeability of the common mode filter, the high-frequency properties of the common mode filter deteriorates. If the amount of resin as a binder of the upper magnetic body 30 is reduced, adhesive properties with the upper magnetic body 30, and the insulating properties and breakdown voltage properties of the upper magnetic body 30 deteriorate.

In addition, in order to increase the magnetic permeability of the common mode filter, a high-temperature environment is provided during shaping of the upper magnetic body 30. However, processability can be reduced at a high temperature, facilities for increasing a temperature can be required, and the reliability of the common mode filter can be reduced.

SUMMARY OF THE INVENTION

An object of the present invention is to provide a method of manufacturing a noise removing filter, by which the noise removing filter may obtain high magnetic permeability while retaining excellent adhesive properties with an upper magnetic body, and excellent insulating properties and breakdown voltage properties so as to increase impedance characteristics, thereby increasing the performance and reliability of the noise removing filter.

Another object of the present invention is to provide a method of manufacturing a noise removing filter, by which the magnetic permeability of the noise removing filter may be increased by using a simple structure and process, thereby reducing manufacturing costs required to reduce the number of facilities for increasing the magnetic permeability and increasing the productivity of the noise removing filter.

Another object of the present invention is to provide a method of manufacturing a noise removing filter, by which input/output stud terminals are prevented from being damaged during polishing of an upper magnetic body and an accurate polishing process satisfying a desired design is performed.

According to an exemplary embodiment of the present invention, there is provided a method of manufacturing a noise removing filter, including: preparing at least one conductive pattern, an insulating layer for covering the at least one conductive pattern, and a lower magnetic body including input/output stud terminals for electrically inputting and outputting electricity to and from the at least one conductive pattern; disposing a recognizable portion on upper surfaces of the input/output stud terminals; disposing an upper magnetic body on the recognizable portion and the insulating layer; polishing the upper magnetic body; and removing the recognizable portion such that a level of an upper surface of the upper magnetic body is higher than levels of the upper surfaces of the input/output stud terminals.

Here, the recognizable portion may include a recognizable material, and the recognizable material may be offset-printed on the upper surfaces of the input/output stud terminals.

In this case, the recognizable material may include photoresist.

In addition, the offset-printing may be performed by printing the recognizable material on the upper surfaces of the input/output stud terminals while rotating a cylinder having an outer circumference surface on which the recognizable material is transferred.

The polishing of the upper magnetic body may be performed until the recognition is exposed to the outside.

In addition, the removing of the recognizable portion may be performed by an etching process.

BRIEF DESCRIPTION OF THE DRAWINGS

FIG. 3 is a cross-sectional view illustrating a case where primary conductive patterns, secondary conductive patterns, an insulating layer, and input/output stud terminals are disposed on a lower magnetic body;

FIG. 4 is a cross-sectional view of a case where a recognizable portion is disposed on the input/output stud terminals shown in FIG. 3;

FIG. 5 is a cross-sectional view illustrating a cylinder for offset-printing the recognizable portion shown in FIG. 4;

FIG. 6 is a cross-sectional view illustrating a case where an upper magnetic body is disposed on the recognizable portion and the insulating layer shown in FIG. 4;

FIG. 7 is a cross-sectional view of a case where the upper magnetic body shown in FIG. 6 is polished.

DESCRIPTION OF THE PREFERRED EMBODIMENTS

Figure 1:
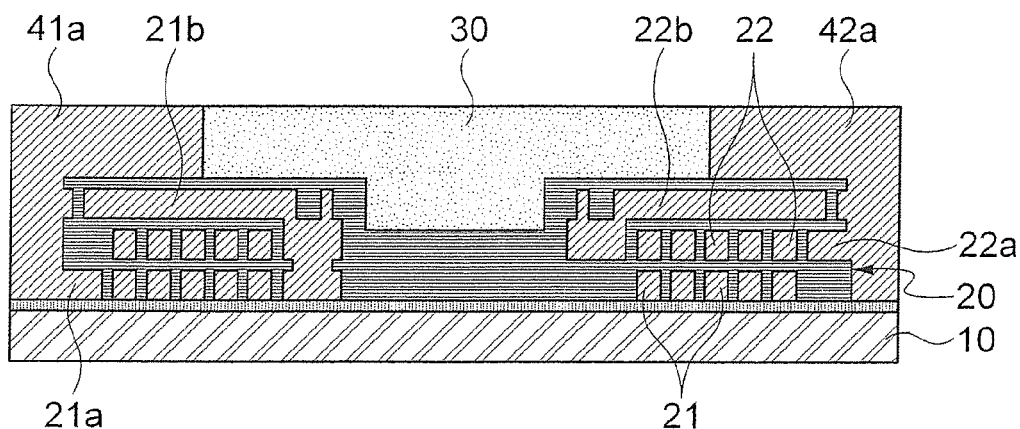
FIG. 1 is a cross-sectional view of a common mode filter of a typical noise removing filter.
Figure 2A:
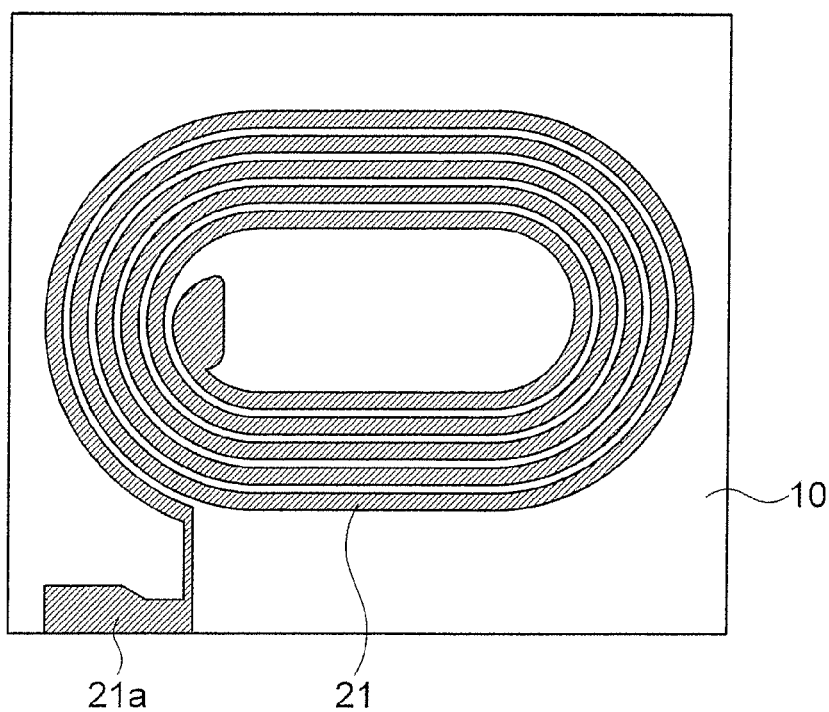
FIG. 2A is a schematic plan view of a primary coil pattern show in FIG. 1.
Figure 2B:
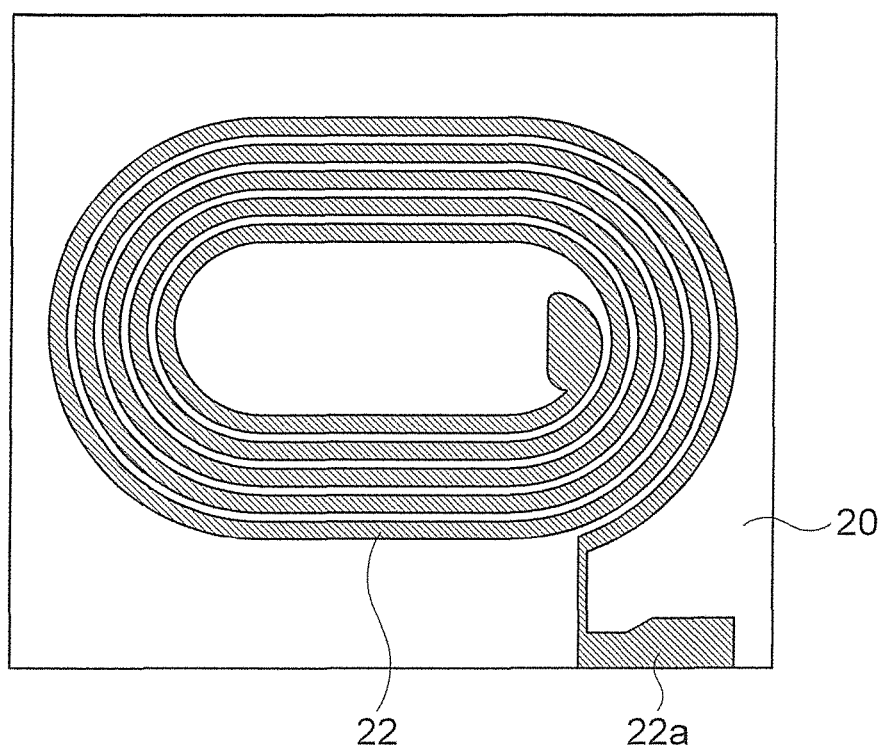
FIG. 2B is a schematic plan view of a secondary coil pattern shown in FIG. 1.
Figure 2C:
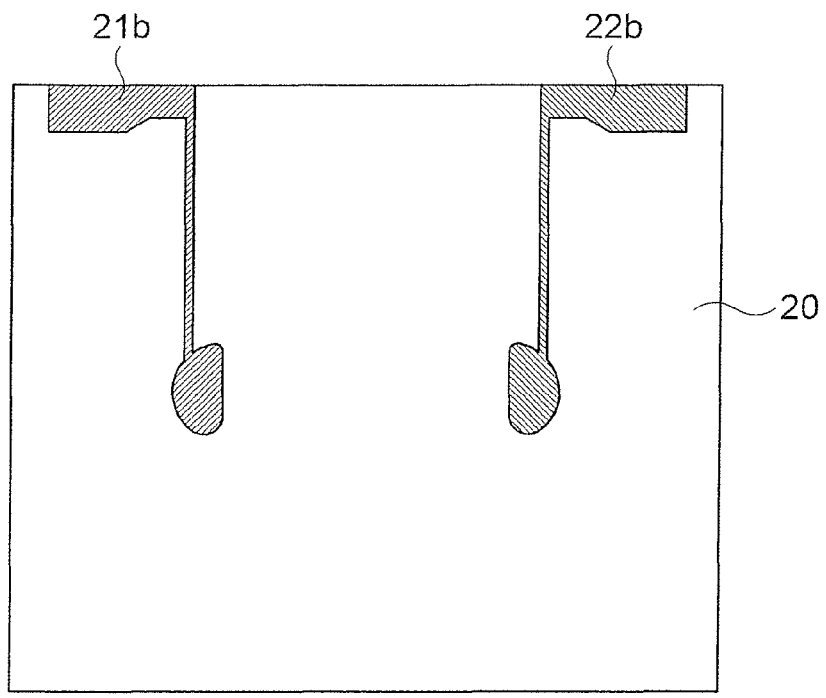
FIG. 2C is a schematic plan view of an output lead pattern of the primary coil pattern shown in FIG. 2A and an output lead pattern of the secondary soil pattern shown in FIG. 2B.

Hereinafter, the present invention will be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Throughout this specification, like reference numerals in the drawings denote like elements.

Unless defined otherwise, technical and scientific terms used herein have the same meaning as is commonly understood by one of skill in the art to which this invention belongs. An expression used in the singular encompasses the expression of the plural, unless it has a clearly different meaning in the context. Also, it is to be understood that the terms such as "comprise" and/or "comprising" are intended to indicate the existence of the features, numbers, steps, actions, components, parts, or combinations thereof, and are not intended to preclude the possibility that one or more other features, numbers, steps, actions, components, parts, or combinations thereof may exist or may be added.

The present invention will be described more fully with reference to cross-sectional views and/or plan views, in which exemplary embodiments of the invention are shown. In the drawings, the thicknesses of layers and regions are exaggerated for clarity. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an etching region that is illustrated to have a right angle may have a rounded shape or a shape having a predetermined curvature. Therefore, in the drawings, regions are exemplified to illustrate schematic properties and particular shapes, but are not intended to limit the scope of the invention.

Hereinafter, a method of manufacturing a noise removing filter will be described with regard to exemplary embodiments of the invention with reference to FIGS. 3 through 8.

Figure 3:
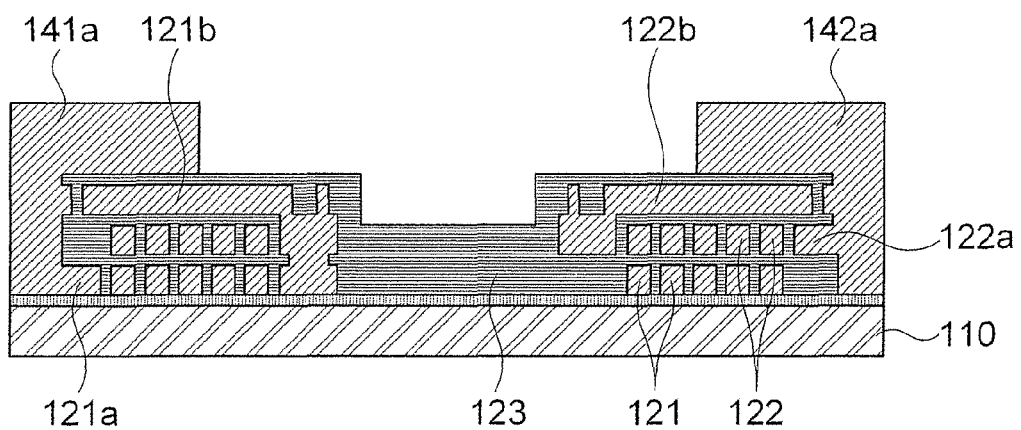
FIGS. 3 through 7 are process diagrams for explaining a method of manufacturing a noise removing filter, according to an embodiment of the present invention.
Figure 4:
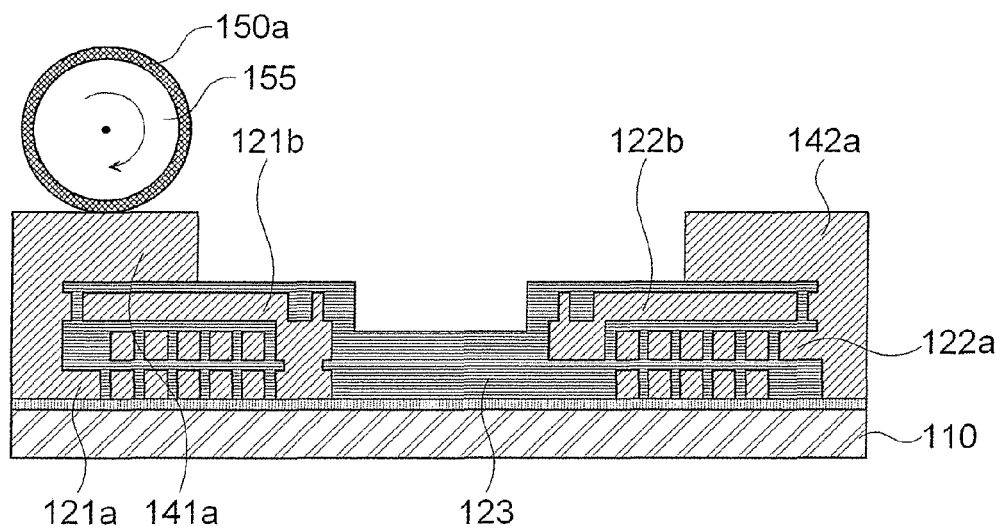
Figure 5:
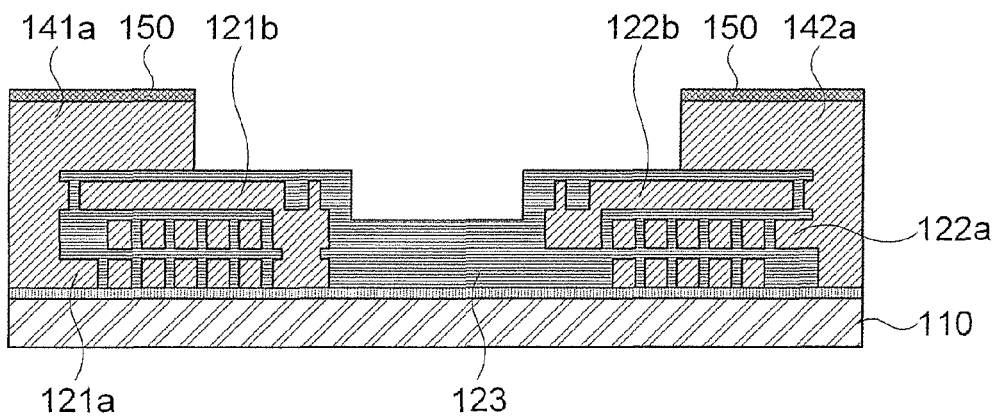
Figure 6:
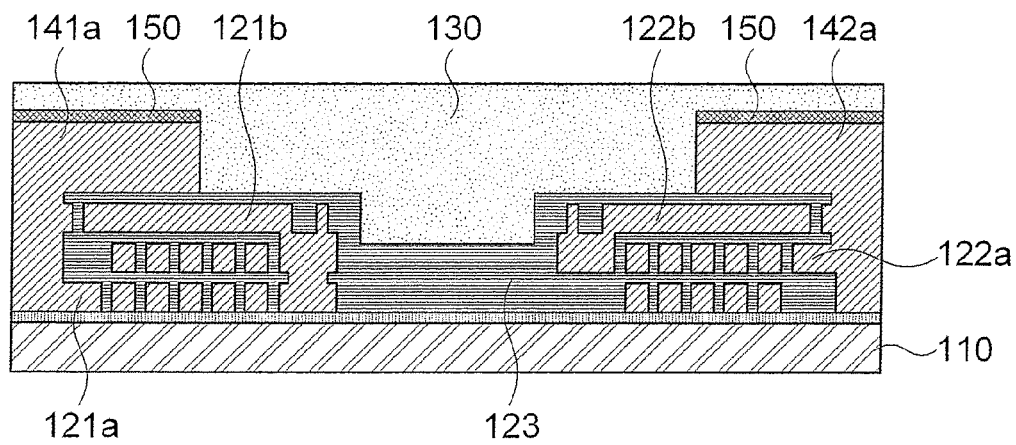
Figure 7:
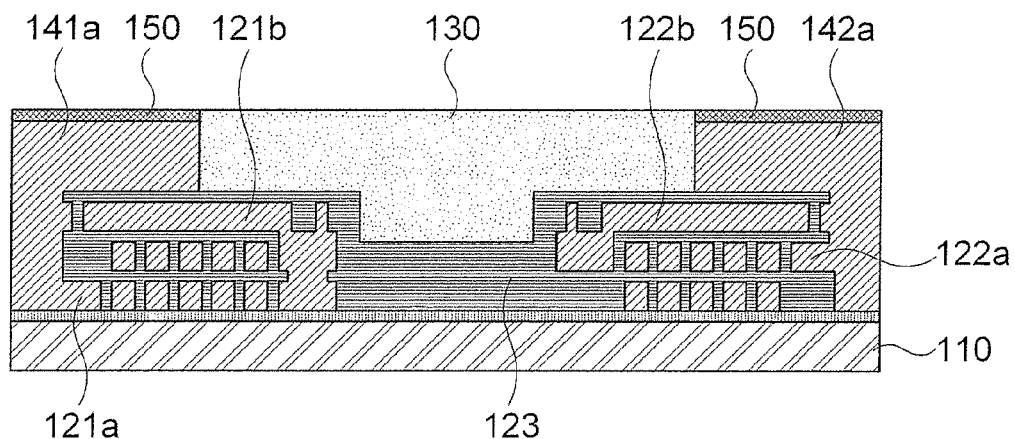
Figure 8:
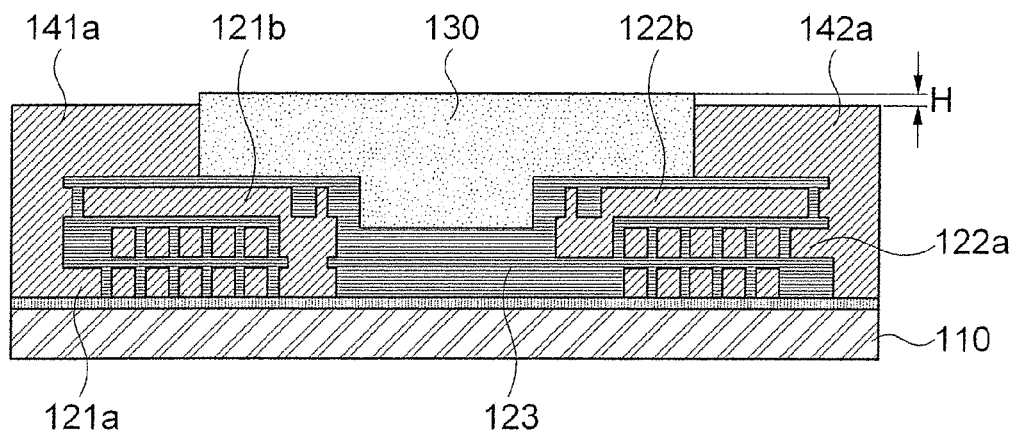
FIG. 8 is a cross-sectional view illustrating a case where the recognizable portion shown in FIG. 7 is removed.

FIGS. 3 through 7 are process diagrams for explaining a method of manufacturing a noise removing filter, according to an embodiment of the present invention. FIG. 3 is a cross-sectional view illustrating a case where primary conductive patterns 121, secondary conductive patterns 122, an insulating layer 123, and input/output stud terminals are disposed on a lower magnetic body 110. FIG. 4 is a cross-sectional view of a case where a recognizable portion 150 is disposed on the input/output stud terminals shown in FIG. 3. FIG. 5 is a cross-sectional view illustrating a cylinder 155 for offset-printing the recognizable portion 150 shown in FIG. 4. FIG. 6 is a cross-sectional view illustrating a case where an upper magnetic body 130 is disposed on the recognizable portion 150 and the insulating layer 123 shown in FIG. 4. FIG. 7 is a cross-sectional view of a case where the upper magnetic body 130 shown in FIG. 6 is polished. FIG. 8 is a cross-sectional view illustrating a case where the recognizable portion 150 shown in FIG. 7 is removed.

In the method of manufacturing the noise removing filter according to the present embodiment, referring to FIG. 3, a coil layer including the primary conductive patterns 121, the secondary conductive patterns 122, and the insulating layer 123 may be formed on the lower magnetic body 110.

Here, the lower magnetic body 110 may be prepared in the form of a substrate formed of a ferrite-based magnetic material. The primary conductive patterns 121 and the secondary conductive patterns 122 may be formed on the lower magnetic body 110 so as to be electrically disconnected from each other by using the insulating layer 123 as a medium.

In this case, the insulating layer 123 may include a first input lead pattern 121a for inputting electricity to the primary conductive patterns 121, a first output lead pattern 121b for outputting electricity from the primary conductive patterns 121, a second input lead pattern 122a for inputting electricity to the secondary conductive patterns 122, and a second output lead pattern 122b for outputting electricity from the secondary conductive patterns 122.

In addition, the first input lead pattern 121a may be electrically connected to a first input stud terminal 141a. The first output lead pattern 121b may be electrically connected to a first output stud terminal (not shown) corresponding to the first input stud terminal 141a. The second input lead pattern 122a may be electrically connected to a second input stud terminal 142a. The second output lead pattern 122b may be electrically connected to a second output stud terminal (not shown) corresponding to the second input stud terminal 142a.

Then, referring to FIGS. 4 and 5, the recognizable portion 150 may be disposed on upper surfaces of the first and second input/output stud terminals.

Here, the recognizable portion 150 may be formed of a recognizable material such as photoresist, which may be offset-printed on the upper surfaces of the first and second input/output stud terminals.

In this case, the offset printing may be performed by printing the recognizable material 150a on the upper surfaces of the first and second input/output stud terminals while rotating the cylinder 155 having an outer circumference surface on which the recognizable material 150a is transferred.

Then, referring to FIG. 6, the upper magnetic body 130 may be disposed on the recognizable portion 150 and the insulating layer 123.

In this case, the upper magnetic body 130 may be formed by filling a space with a ferrite-based material and hardening the ferrite-based material.

Here, the upper magnetic body 130 may be formed to have sufficient height and thickness in consideration of a process for covering the recognizable portion 150 and abrasion such as surface polishing.

Then, referring to FIG. 7, polishing may be performed for surface abrasion of the upper magnetic body 130.

In this case, in the method of manufacturing the noise removing filter according to the present embodiment, since the recognizable portion 150 is disposed on the upper surfaces of the first and second input/output stud terminals, the first and second input/output stud terminals may be prevented from being damaged during the polishing of the upper magnetic body 130. In addition, since the polishing of the upper magnetic body 130 is performed until the recognizable portion 150 is exposed to the outside, a point of time when the polishing needs to be finished may be easily and accurately recognized, and thus, an accurate polishing process satisfying a desired design of the upper magnetic body 130 may be performed.

Then, referring to FIG. 8, after the polishing of the upper magnetic body 130 is performed, the recognizable portion 150 may be removed such that a level of an upper surface of the upper magnetic body 130 may be higher than levels of the upper surfaces of the first and second input/output stud terminals by as much as the thickness of the recognizable portion 150.

That is, when the method of manufacturing the noise removing filter according to the present embodiment is used, a height difference (H) may be obtained between the level of the upper surface of the upper magnetic body 130 and the levels of the upper surfaces of the first and second input/output stud terminals, and thus, the size of the upper magnetic body 130 and the number of magnetic components may be increased, thereby increasing the magnetic permeability of the noise removing filter including the upper magnetic body 130.

The recognizable portion 150 may be removed by an etching process.

As described above, when a method of manufacturing a noise removing filter according to the present invention is used, an upper magnetic body including ferrite powders, which varies according to an interval between input and output stud terminals of the noise removing filter, may be selectively injected, thereby increasing the magnetic permeability of the noise removing filter.

When a method of manufacturing a noise removing filter according to the present invention is used, the noise removing filter may have high magnetic permeability so as to improve impedance characteristics, thereby increasing the performance and reliability of a product.

Moreover, when a method of manufacturing a noise removing filter according to the present invention is used, the magnetic permeability of the noise removing filter may be increased by using a simple structure and process, thereby increasing productivity and reducing manufacturing costs required to increase the number of facilities.

In addition, when a method of manufacturing a noise removing filter according to the present invention is used, a recognizable portion is disposed on an upper surface input/output stud terminals prior to polishing of an upper magnetic body, and thus, the input/output stud terminals may be prevented from being damaged during the polishing of the upper magnetic body, and an accurate polishing process satisfying a desired design may be performed.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A method of manufacturing a noise removing filter, comprising:

preparing at least one conductive pattern, an insulating layer for covering the at least one conductive pattern, and a lower magnetic body comprising input/output stud terminals for electrically inputting and outputting electricity to and from the at least one conductive pattern;

disposing a recognizable portion on upper surfaces of the input/output stud terminals;

disposing an upper magnetic body on the recognizable portion and the insulating layer;

polishing the upper magnetic body; and removing the recognizable portion such that a level of an upper surface of the upper magnetic body is higher than levels of the upper surfaces of the input/output stud terminals.

2. The method according to claim 1, wherein the recognizable portion comprises a recognizable material, and the recognizable material is offset-printed on the upper surfaces of the input/output stud terminals.

3. The method according to claim 2, wherein the recognizable material comprises photoresist.

4. The method according to claim 2, wherein the offset-printing is performed by printing the recognizable material on the upper surfaces of the input/output stud terminals while rotating a cylinder having an outer circumference surface on which the recognizable material is transferred.

5. The method according to claim 1, wherein the polishing of the upper magnetic body is performed until the recognizable portion is exposed to the outside.

6. The method according to claim 1, wherein the removing of the recognizable portion is performed by an etching process.

* * * * *